United States Patent
Chen

(10) Patent No.: US 12,400,959 B2
(45) Date of Patent: Aug. 26, 2025

(54) SYSTEMS AND METHODS FOR PROVIDING MULTIPLE GPIO SUPPLY MODES

(71) Applicant: Taiwan Semiconductor Manufacturing Company, Ltd., Hsinchu (TW)

(72) Inventor: Bo-Ting Chen, Taichung County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 610 days.

(21) Appl. No.: 17/571,680

(22) Filed: Jan. 10, 2022

(65) Prior Publication Data

US 2022/0415797 A1 Dec. 29, 2022

Related U.S. Application Data

(60) Provisional application No. 63/214,854, filed on Jun. 25, 2021.

(51) Int. Cl.
*H01L 23/52* (2006.01)
*H01L 21/768* (2006.01)
*H01L 23/528* (2006.01)

(52) U.S. Cl.
CPC ........ *H01L 23/5286* (2013.01); *H01L 21/768* (2013.01)

(58) Field of Classification Search
CPC .................................................. H01L 23/5286
See application file for complete search history.

(56) References Cited

U.S. PATENT DOCUMENTS

| | | | |
|---|---|---|---|
| 2003/0235019 A1* | 12/2003 | Ker ....................... | H10D 89/921 257/E23.079 |
| 2005/0128664 A1* | 6/2005 | Pilling ................ | H01L 27/0251 257/E23.079 |
| 2007/0097581 A1* | 5/2007 | Khazhinsky ........... | H02H 9/046 361/111 |
| 2019/0348361 A1 | 11/2019 | Aipperspach et al. | |
| 2021/0175172 A1* | 6/2021 | Sobue .................. | H10D 89/921 |
| 2023/0411310 A1* | 12/2023 | Sic .......................... | H01L 23/50 |

FOREIGN PATENT DOCUMENTS

| | | |
|---|---|---|
| CN | 108695301 | 10/2018 |
| EP | 1676319 | 7/2006 |
| TW | 200400612 | 1/2004 |

OTHER PUBLICATIONS

Taiwanese Office Action; Application No. 111108893; Dated Feb. 24, 2023.

* cited by examiner

*Primary Examiner* — Benjamin P Sandvik
(74) *Attorney, Agent, or Firm* — Jones Day

(57) ABSTRACT

Systems and methods are provided for a multiple power supply mode input/output (IO) circuit of an integrated circuit that includes a plurality of power rails, one or more supply mode power rails being associated with each supply mode of the integrated circuit, and a core power rail being associated with core circuitry of the integrated circuit. The IO circuit may further include a plurality of chip connection points, each chip connection point being connected to one or more of the power rails, the chip connection points being configured for connection to one or more package connection points.

20 Claims, 7 Drawing Sheets

SYSTEMS AND METHODS FOR PROVIDING MULTIPLE GPIO SUPPLY MODES

CROSS-REFERENCE TO RELATED APPLICATIONS

This application claims priority to U.S. Provisional Application No. 63/214,854, filed Jun. 25, 2021, which is incorporated herein by reference in its entirety.

BACKGROUND

An integrated circuit may take the form of a set of electronic circuits embodied on a piece of semiconductor material, oftentimes silicon. In many implementations, the integrated circuit is designed to provide certain computing functions. In some instances those computing functions may be based on data or signals input to the integrated circuit from one or more sources external to the integrated circuit. In certain examples, the integrated circuit may further output data or signals that the integrated circuit generates based on its computing functions to destinations external to the integrated circuit.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
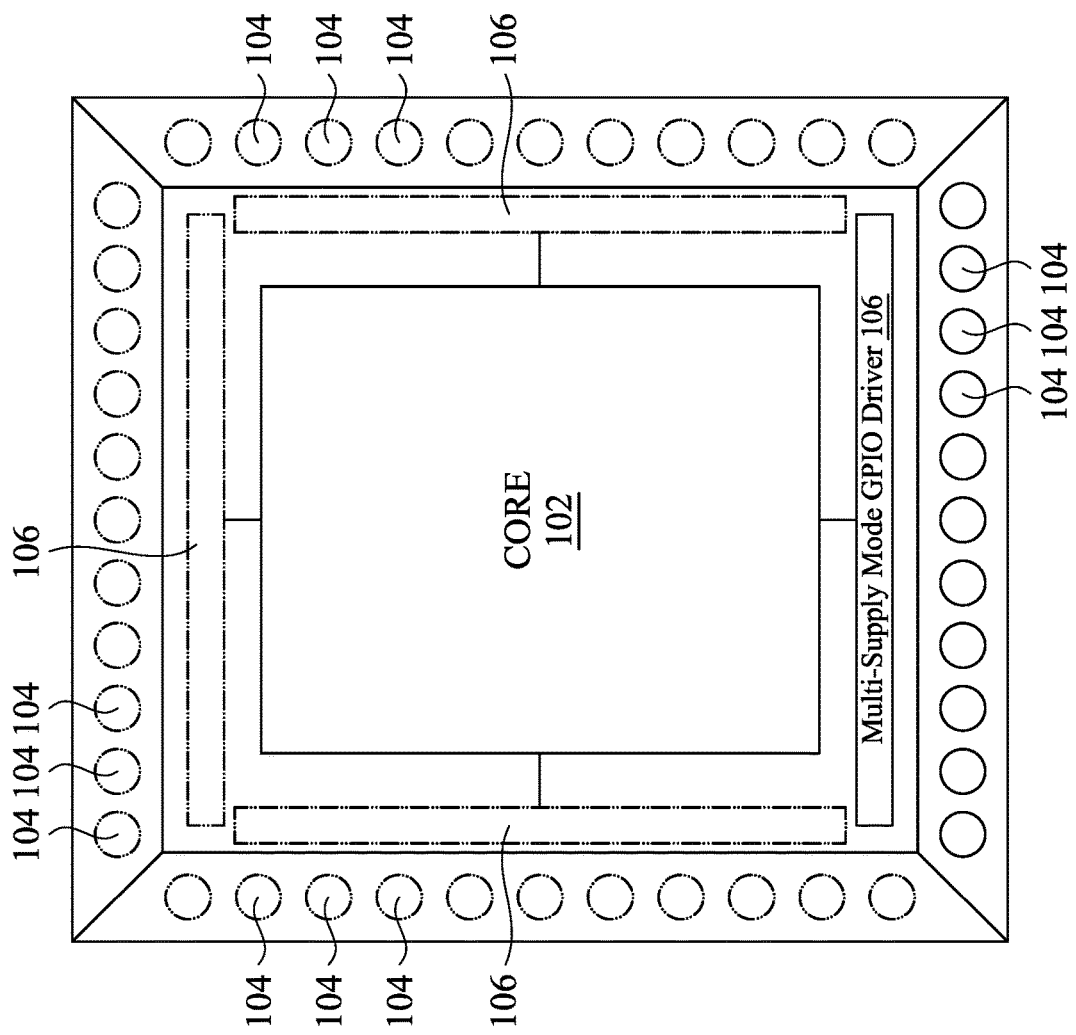
FIG. 1 is a diagram depicting an integrated circuit that provides multiple power supply modes for integrating with external circuitry.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the circuit. Some of the features described below can be replaced or eliminated for different embodiments. Although some embodiments are discussed with operations performed in a particular order, these operations may be performed in another logical order.

As noted above, an integrated circuit is a combination of circuitry that is often configured for performing computing functions based on data inputs and/or data outputs. Design and fabrication of integrated circuits is time consuming and often expensive. In some instances, the computing function of an integrated circuit might be desired by multiple different systems that operate according to different physical specifications. For example a graphics processing integrated circuit may provide graphics-related computing that would be beneficial to multiple different types of mobile devices. But those different types of mobile devices may operate according to different physical specifications. For example, a first mobile device by a first manufacturer may operate at a first voltage level (e.g., 1.8V), while a second mobile device may operate at a second voltage level (e.g., 3.3V). This could be addressed by providing manufacturer specific integrated circuits, one configured to communicate with the first mobile device at 1.8V and a second to communicate with the second mobile device at 3.3V. But in some instances, it may be advantageous to provide a single integrated circuit that can work with different devices using different supply modes (e.g., operate with the first mobile device in a first, 1.8V supply mode and operate with the second mobile device in a second, 3.3V supply mode).

In embodiments, it may be desirable for an integrated circuit to operate in 2-to-n different supply modes (e.g., 2, 3, 4, . . . ). For example an SD3.0 card may be configured to operate in 1.8V/3.3V dual supply modes, an RGMII circuit may be configured to operate in 1.8V/2.5V/3.3V triple supply modes, an RFEE/SPMI circuit may be configured to operate in 1.2V/1.8V dual supply modes, a circuit may be configured to provide a 1.8V MIPI interface for mature technologies (e.g., N7~C018 nodes AP) and 1.2V for more recent N5 node AP), and a PMIC circuit may be configured to operate in 4 or more power supply modes.

Embodiments of systems and methods described herein provide bonding or system package configurations to over multiple supply modes for input/output to integrated circuits, such as general purpose input/output (GPIO) that can provide power, performance, and area benefits in circuit design. Embodiments herein can provide chip connection points (e.g., on a surface of a chip, around a perimeter of a chip), where certain of those connection points (e.g., pins, solder bumps, wire bond connection points, flip-chip connections, other circuit interconnection mechanisms) may be configured for connection to external circuitry operating in a first supply mode, while other of those connection points being configured for connection to external circuitry operating in a second, different supply mode. The integrated circuit may be connected to multiple external circuits, which may all operate in the same supply mode or which may operate in different supply modes.

FIG. 1 is a diagram depicting an integrated circuit that provides multiple power supply modes for integrating with external circuitry in accordance with embodiments. The integrated circuit 100 includes core circuitry 102. The core circuitry 102 is configured to provide computing functionality, where the core circuitry 102 is configured to operate at a core voltage level (e.g., at a high voltage level of 0.9V). The integrated circuit further includes a plurality of chip connection points 104 that facilitate communication with one or more external circuits. In the example of FIG. 1, the connection points 104 are points configured for wire bond or flip-chip connections to the one or more external circuits. Communications to/from the core circuitry 102 and external circuitry via the connections points 104 is facilitated by an IO driver, such as the multi-supply mode GPIO driver 106 depicted in FIG. 1. The driver circuitry 106, in embodiments, is configured to interface communications to/from the core circuitry operating at the core voltage level with external circuitry operating in supply modes having different voltage levels (e.g., a 1.2V high voltage supply mode, a 3.3V high voltage supply mode).

Chip connection points 104 and corresponding IO drivers 106 may take a variety of forms. The chip connection points 104 may be formed along multiple sides of the integrated circuit 100, with IO drivers 106 positioned nearby to facilitate communications. For example, chip connection points 104 may be positioned on two sides of the integrated circuit 100 with one IO driver 106 positioned on each of those sides in a dual in-line package structure. In another example, chip connection points 104 may be positioned on four sides of the integrated circuit 100 (e.g., as depicted in FIG. 1), with four (or more) IO drivers 106 positioned along the four sides of the integrated circuit 100.

Figure 2:
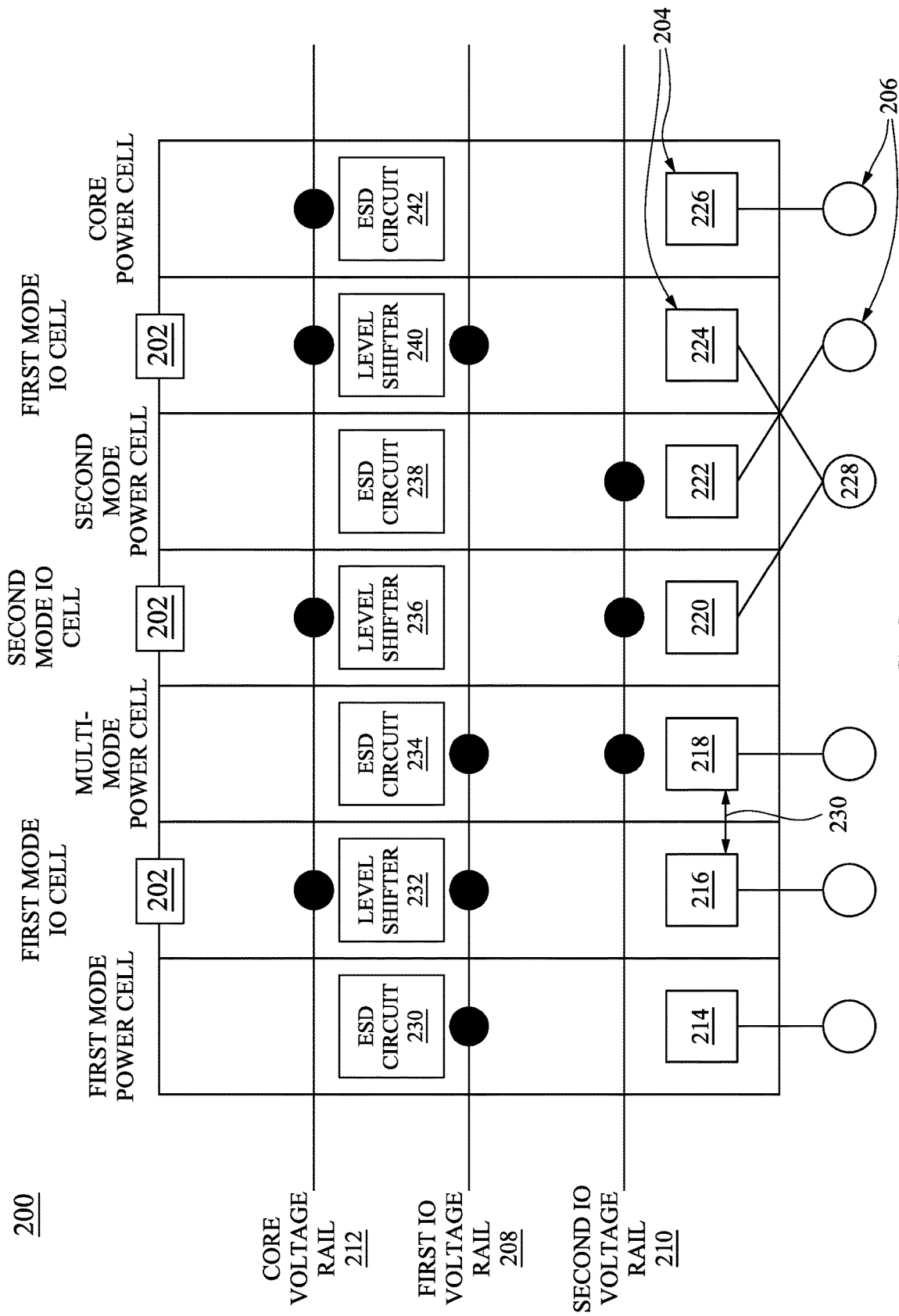
FIG. 2 is a diagram depicting a multi-supply mode input/output (IO) driver in accordance with embodiments.

FIG. 2 is a diagram depicting a multi-supply mode IO driver in accordance with embodiments. The IO circuit 200 includes core connections 202 that facilitate communications between core circuitry (e.g., FIG. 1 at 102) and the IO circuit. Those core connections 202 may take the form of one or more pins that facilitate communication of bits of data in serial or in parallel. The IO circuit 200 further includes chip connection points 204. The chip connection points 204 facilitate communication with external circuitry via package connection points 206. Each of the chip connection points 204 are connected to one or more of the package connection points 206 as described further herein. The package connection points 206 communicate with external circuitry using pins, bumps, wire bumps, or other interconnection mechanism.

The IO circuit 200 further includes a plurality of power rails 208, 210, 212 for communicating signals within the IO circuit. In embodiments, the IO circuit includes a plurality of power rails, one or more supply mode power rails 208, 210 associated with each supply mode of the integrated circuit, and a core power rail 212 associated with the core circuitry of the integrated circuit. The first IO voltage rail 208 operates at the operating voltage of the first voltage mode (e.g., 1.2V), the second IO voltage rail 210 operates at the operating voltage of the second voltage mode (e.g., 1.8V), and the core voltage rail 212 operates at the operating voltage of the core (e.g., 0.9V, 1.2V).

Each chip connection point 204 is connected to one or more of the power rails 208, 210, 212, where a connection point 204, its connection to one or more of the power rails 208, 210, 212, and any circuitry facilitating signals therein is referred to herein as a cell. For example, chip connection point 214 is connected to the first IO voltage rail 208 (as indicated by the solid dot) in a first supply mode power cell. That power cell includes electrostatic discharge circuitry 230 (e.g., a diode having one terminal connected to chip connection point 214, one terminal connected to the first IO voltage rail 208, and one terminal connected to a ground rail) configured to prevent large currents on the first IO voltage rail 208, such as currents that might be produced when a person touches a contact associated with chip connection point 214.

Chip connection point 216 is associated with an IO cell of the first supply mode. Communications between the core circuitry and chip connection point 216 are facilitated, as inputs to the core circuitry, outputs from the core circuitry, or both, by a level shifter 232 that converts signals from the core voltage level (e.g., 0.9V) to the operating voltage of the first voltage mode (e.g., 1.2V) and/or vice versa.

Chip connection point 218 is connected to the first IO voltage rail 208 and the second IO voltage rail 210 in a multi-mode power cell. Like the power cell associated with chip connection point 214, the multi-mode power cell provides electrostatic discharge circuitry 234 for mitigating large, unwanted currents on either of the first and second IO voltage rails 208, 210.

Chip connection point 220 is associated with an IO cell of the second supply mode. Communications between the core circuitry and chip connection point 220 are facilitated, as inputs to the core circuitry, outputs from the core circuitry, or both, by a level shifter 236 that converts signals from the core voltage level (e.g., 0.9V) to the operating voltage of the second voltage mode (e.g., 1.8V) and/or vice versa.

Chip connection point 222 is connected to the second IO voltage rail 210 in a second supply mode power cell. That power cell includes electrostatic discharge circuitry 238 (e.g., a diode having one terminal connected to chip connection point 222, one terminal connected to the second IO voltage rail 210, and one terminal connected to a ground rail) configured to prevent large currents on the second IO voltage rail 210.

Chip connection point 224 is connected to the first IO voltage rail 208 and the core voltage rail 212 in a second example of a first mode IO cell having level shifter 240. Each type of cell may be present in one or more instances in a multi-supply mode IO driver.

Chip connection point 226 is connected to the core voltage rail 212 in a core power cell. That power cell includes electrostatic discharge circuitry 242 (e.g., a diode having one terminal connected to chip connection point 226, one terminal connected to the core voltage rail 212, and one terminal connected to a ground rail) configured to prevent large currents on the core voltage rail 212 (e.g., currents that could adversely affect or damage core circuitry).

As depicted in FIG. 2, each of the chip connection points 214-226 may be connected to one or more package connection points 206, where connections to external circuits may be made via connection of those external circuits to the package connection points. In the example of FIG. 2, each of chip connection points 214, 216, 218, 222, and 226 are electrically connected to one package connection point, while chip connection points 220, 224 are each connected to a common package connection point 228. To facilitate connection of multiple chip connection points to a common package connection point, or multiple package connection points to a common chip connection point, chip connection points may be positioned no more than a threshold distance apart from one another (e.g., 200 μm, 100 μm, 1 mm), as depicted at 230, to improve the ability of connecting on package connection point to multiple chip connection points (e.g., neighboring chip connection points, chip connection points with 1, 2, 3 chip connection points in between).

In embodiments, an external circuit may be electrically connected to some of the package connection points 206 but not others. For example, an external circuit configured to operate at a first supply mode voltage (e.g., 1.2 V), may be configured to connect to package connection points associated with one or more of first mode power cells, first mode IO cells, multi-mode power cells, and core power cells. In embodiments, that external circuit may not be connected to the second mode IO cells and the second mode power cell. A second external circuit configured to operate at a second supply mode voltage (e.g., 1.8V) may be configured to connect to package connection points associated with one or more of second mode power cells, second mode IO cells, multi-mode power cells, and the core power cell. In embodiments, that second external circuit may not be connected to the package connection points associated with the first mode power cells and the first mode IO cells. In this fashion, in embodiments, multiple external circuits of differing types operating at different supply modes may be connected to and operate with core circuitry via the multi-mode supply IO driver with little or no configuration changes beyond to which package connection points those external circuits are connected.

Figure 3:
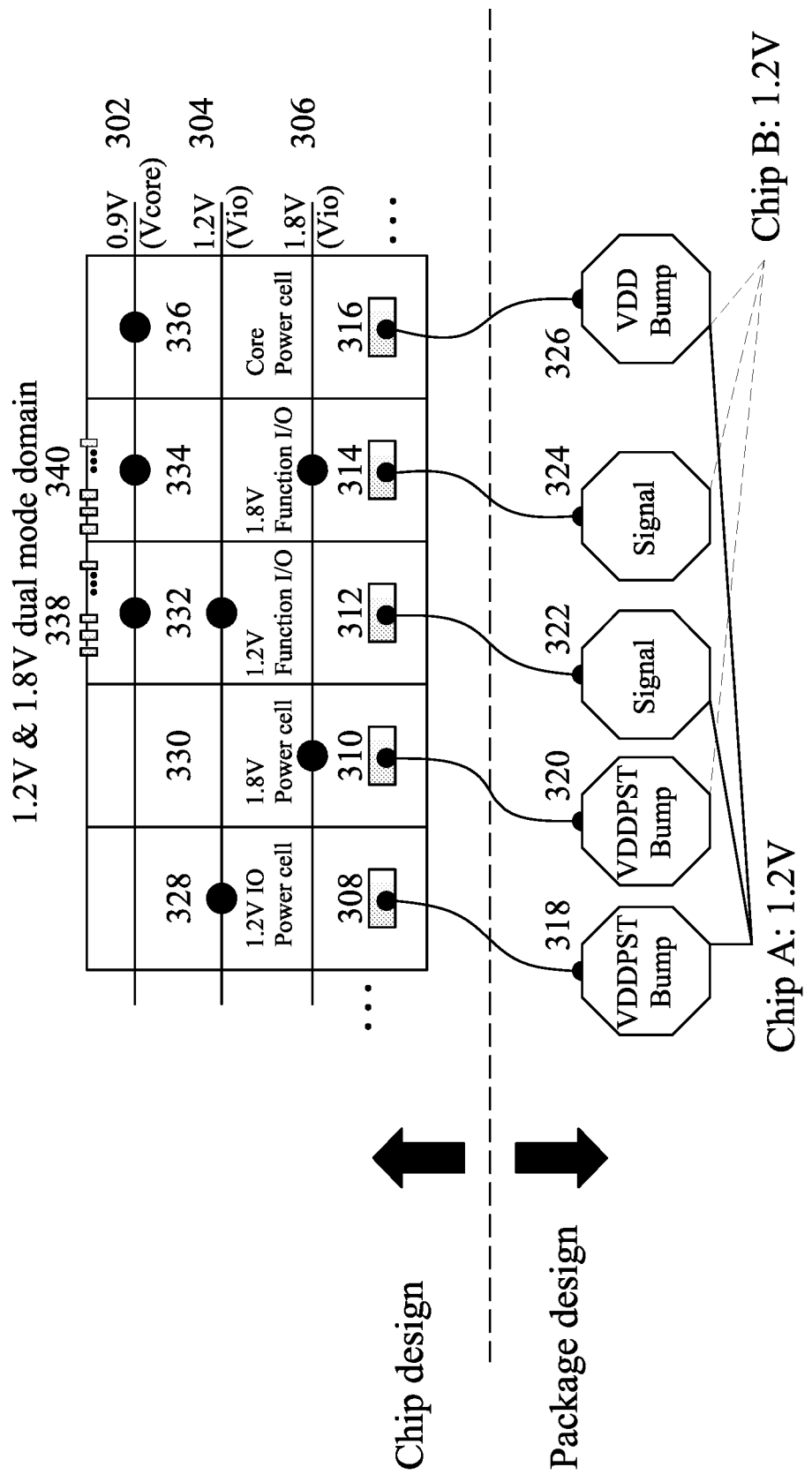
FIG. 3 is a diagram depicting a first multiple power supply mode input/output (IO) circuit of an integrated circuit in accordance with an embodiment.

FIG. 3 is a diagram depicting a first multiple power supply mode input/output (IO) circuit of an integrated circuit in accordance with an embodiment. The circuit 300 interfaces between a core operating at 0.9V and external circuitry that may operate at a first supply mode of 1.2 V and/or a second supply mode of 1.8V. The circuit 300 includes a plurality of power rails, one or more supply mode power rails associated with each supply mode of the integrated circuit, and a core power rail associated with core circuitry of the integrated circuit. Specifically power rail 302 is associated with the core circuitry of the integrated circuit, power rail 304 is associated with the first supply mode, and power rail 306 is associated with the second supply mode. The circuit 300 further includes a plurality of chip connection points 308-316. Each chip connection point is connected to one or more of the power rails 302, 304, 306, the chip connection points being configured for connection to one or more package connection points 318-326.

In the example of FIG. 3, each chip connection point 308-316 is associated with an IO circuit cell 328-336. Each of the IO cells 328-336 is associated with an IO circuit function. Example IO circuit functions include a power providing function, and input/output function, and an electrostatic discharge function. As depicted by the solid dots in FIG. 3, each IO circuit cell 328-336 is associated with a connection to one or more of the power rails 302, 304, 306. For example, an IO circuit cell associated with a power providing function is associated with a connection to a power rail associated with a supply mode, an IO circuit cell associated with an input/output function is associated with a connection to a power rail associated with a supply mode and the core power rail associated with the core circuitry, and an IO cell associated with an electrostatic discharge function is associated with a connection to one of the power rails.

In the example of FIG. 3, the circuit 300 further includes two core IO connection points 338, 340 for receiving data from or providing data to the core circuitry (e.g., 8, 16, 32, 64, 128, 256, 512 bits at a time), where the core circuitry is configured to perform a computing function. Each core IO connection 338, 340 point is connected to the core power rail 302. In the example of FIG. 3, a first core IO connection point 338 is associated with a first IO cell 332 that is associated with power rail 304, and a second core connection point 340 is associated with a second IO cell 334 that is associated with power rail 306.

In the example of FIG. 3, the IO circuit 300 is configured to provide N=2 supply modes, and the IO circuit comprise N+1=3 power rails. In fact, in the example of FIG. 3, the circuit 300 includes exactly N+1=3 power rails.

In the example of FIG. 3, each of the chip connection points 308-316 is configured for connection to a single package connection point (e.g., exactly one package connection point each). Particularly, chip connection point 308 associated with an IO power cell 328 of the first supply mode is connected to package connection point 318; chip connection point 310 associated with an IO power cell 330 of the second supply mode is connected to package connection point 320; chip connection point 312 associated with IO function cell 332 of the first supply mode is connected to package connection point 322; chip connection point 314 associated with an IO function cell 334 of the second supply mode is connected to package connection point 324; and chip connection point 316 associated with core power cell 336 is connected to package connection point 326.

In the example of FIG. 3, the circuit 300 is configured to communicate with a first external circuit operating at the first power mode, where that first external circuit would be connected to package connection point 318 for VDDPST, package connection point 322 for signal communication, and package connection point 326 for VDD. The circuit 300 is further configured to communicate with a second external circuit (e.g., at the same time, in the alternative) operating at the second power mode, where that second external circuit would be connected to package connection point 320 for VDDPST, package connection point 324 for signal communication, and package connection point 326 for VDD.

In embodiments, the circuit 300 can communicate with either of the first external circuit or the second external circuit with no configuration changes beyond connecting the external circuit to the correct package connection points. For example, output signals from the core could be transmitted from the circuit 300 on both of package connection points 322, 324 at the appropriate signal levels of those supply modes, where those signals would be received by any connected external circuits.

Figure 4:
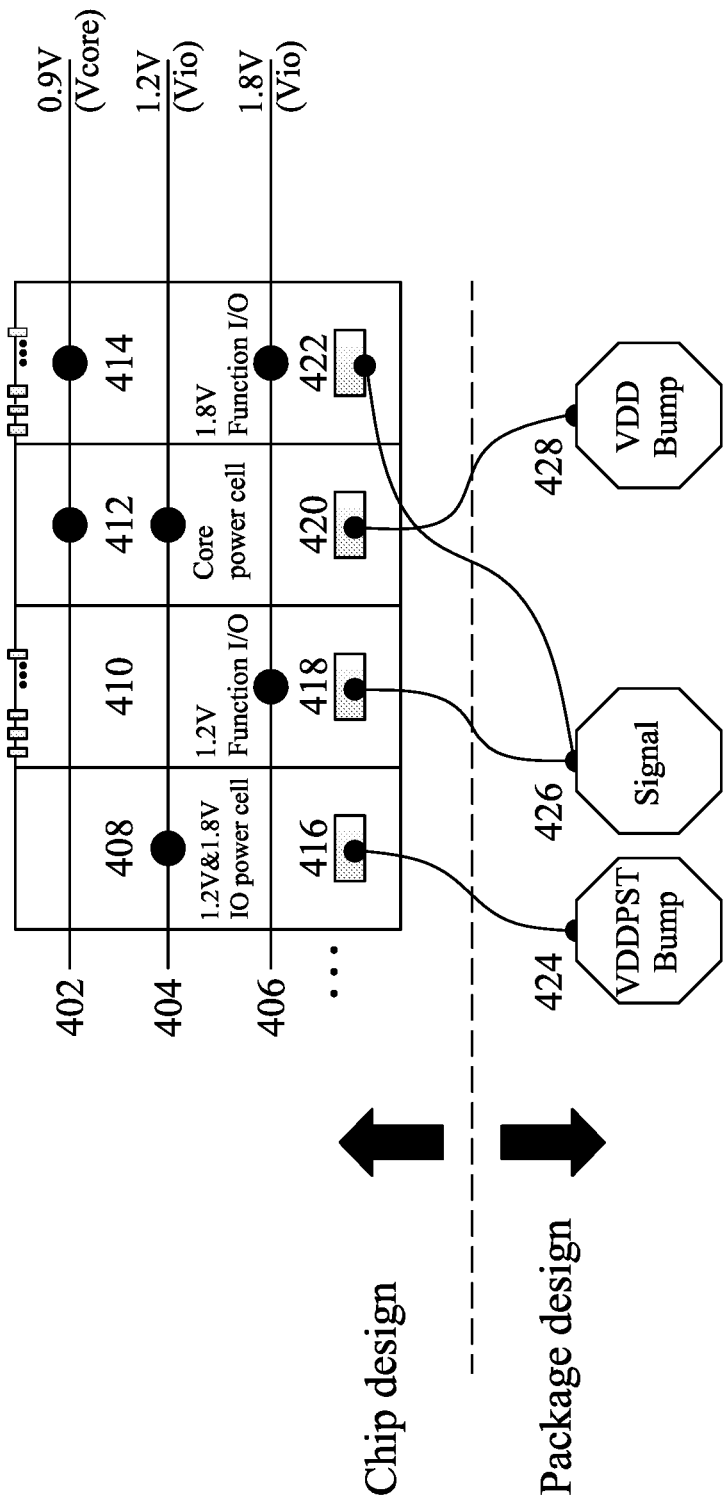
FIG. 4 is a diagram depicting a second multiple power supply mode input/output (IO) circuit of an integrated circuit in accordance with an embodiment.

FIG. 4 is a diagram depicting a second multiple power supply mode input/output (IO) circuit of an integrated circuit in accordance with an embodiment. The circuit 400 includes a plurality of power rails 402, 404, 406. One power rail 402 is associated with core circuitry of the integrated circuit, one power rail 404 is associated with a first supply mode, and another power rail 406 is associated with a second power mode of the integrated circuit. The circuit 400 includes four IO circuit cells 408-414. The IO cells 410, 414 associated with the first and second supply modes, respectively, function similarly to their counterparts in FIG. 3, as does core power cell 412. In the example of FIG. 4, the functionality of the 1.2V and 1.8V power cells of FIG. 3 at 328, 330, including any ESD protection therein, are combined into a single IO power cell 408 associated with both the first and second power modes.

In the example of FIG. 4, at least one of the chip connection points 416-422 is connected to multiple package connection points. Specifically, chip connection point 416 associated with IO power cell 408 associated with both the first and second power modes is connected to package connection point 424, both chip connection points 418 and 422, associated with cell 410 associated with the first power mode and cell 414 associated with the second power mode, respectively, are connected to package connection point 426, and chip connection point 420 associated with core power cell 412 is connected to package connection point 428.

In the example of FIG. 4, an external circuit is connected to package connection point 424 for VDDPST, package connection point 426 for input/output signal transmission, and package connection point 428 for VDD. In embodiments, that external circuit may be configured to operate under either of the first supply mode or the second supply modes. In embodiments, an implementation where external circuits operating under different supply modes are connected to common package connection points (e.g., package connection point 426), then the circuit 400 may be configured (e.g., by setting a configuration parameter, a bit value, a switch) to operate at one of the two available supply modes. In this way, signals a package connection point 426 are transmitted and expected to be received at the selected supply mode voltage level.

Figure 5:
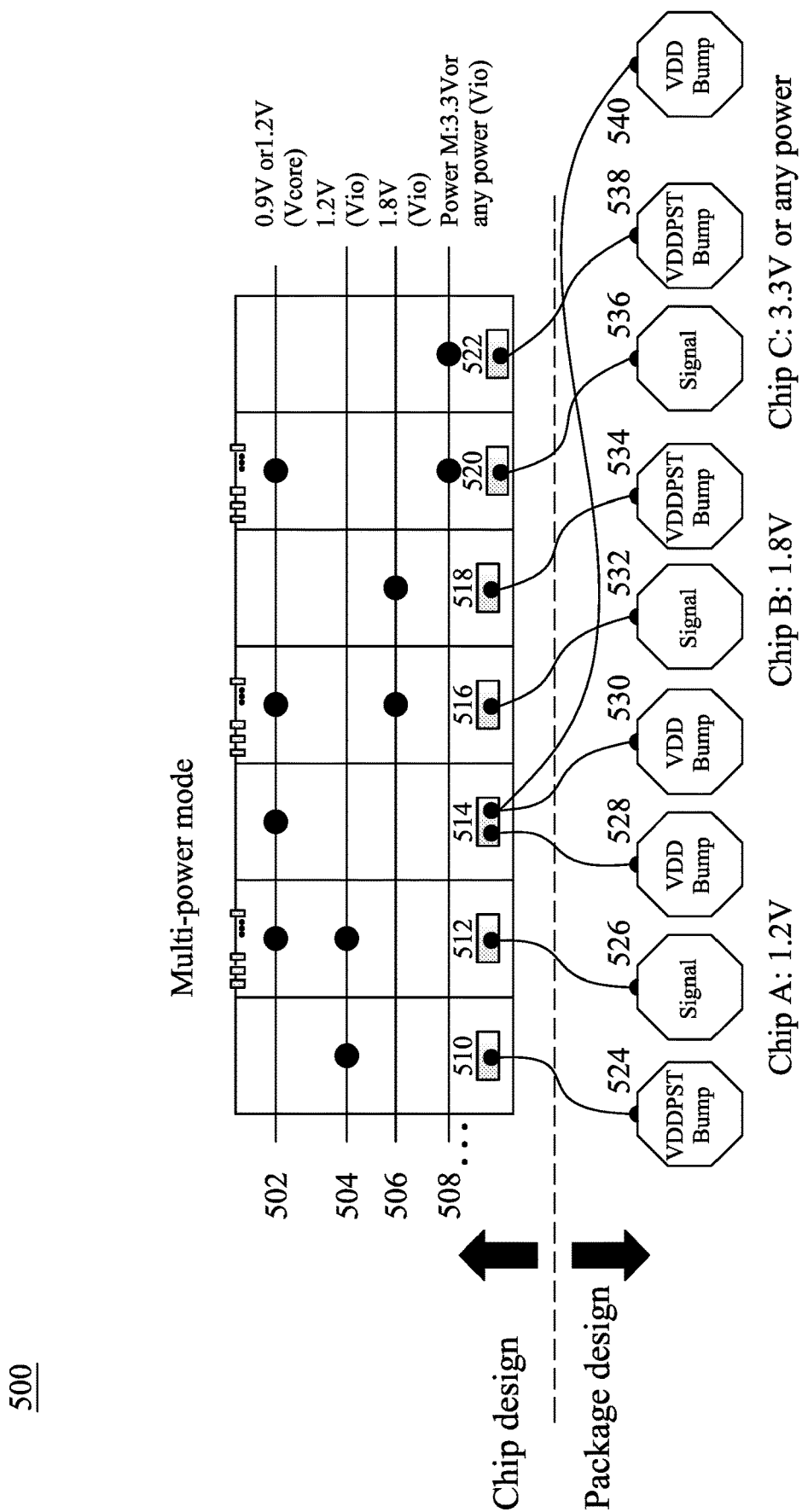
FIG. 5 is a diagram depicting a multiple power supply mode input/output circuit configured to communicate according to three supply modes.

As noted above, a multiple power supply mode input/output circuit may support more than two supply modes in embodiments. FIG. 5 is a diagram depicting a multiple power supply mode input/output circuit configured to communicate according to three supply modes. The circuit 500 includes a plurality of power rails 502-508, one or more supply mode power rails associated with each supply mode of the integrated circuit (i.e., rail 504 associated with a 1.2V supply mode, rail 506 associated with a 1.8V supply mode, and rail 508 associated with a 3.3V supply mode). A core power rail 502 is associated with core circuitry of the integrated circuit. The circuit includes a plurality of chip connection points 510-522 that are connected to different IO circuit cells that provide different functionality via connections to one or more of the power rails 502-508 as described above. Each of the chip connection points 510-522 is configured for connection to one or more package connection points 524-540. Specifically, chip connection points 510, 518, and 522 are connected to package connection points 524, 534, and 538, respectively, to provide VDDPST for each of the three respective power modes. Chip connection points 512, 516, and 520 are connected to package connection points 526, 532, 536 to provide signal communication ports for each of the three respective power modes. Chip connection point 514 is connected to each of package connection points 528, 530, and 540 to provide VDD. An external circuit configured to operate at the first supply mode would be connected to package connection points 524, 526, and 528. An external circuit configured to operate at the second supply mode would be connected to package connection points 530, 532, and 534. An external circuit configured to operate at the third supply mode would be connected to package connection points 536, 538, and 540. In an embodiment, a single package connection point (e.g., package connection point 528) could be provided for connection to an external circuit operating at any of the three supply modes to reduce the number of package connection points (e.g., from 9 to 7) of the circuit.

Figure 6:
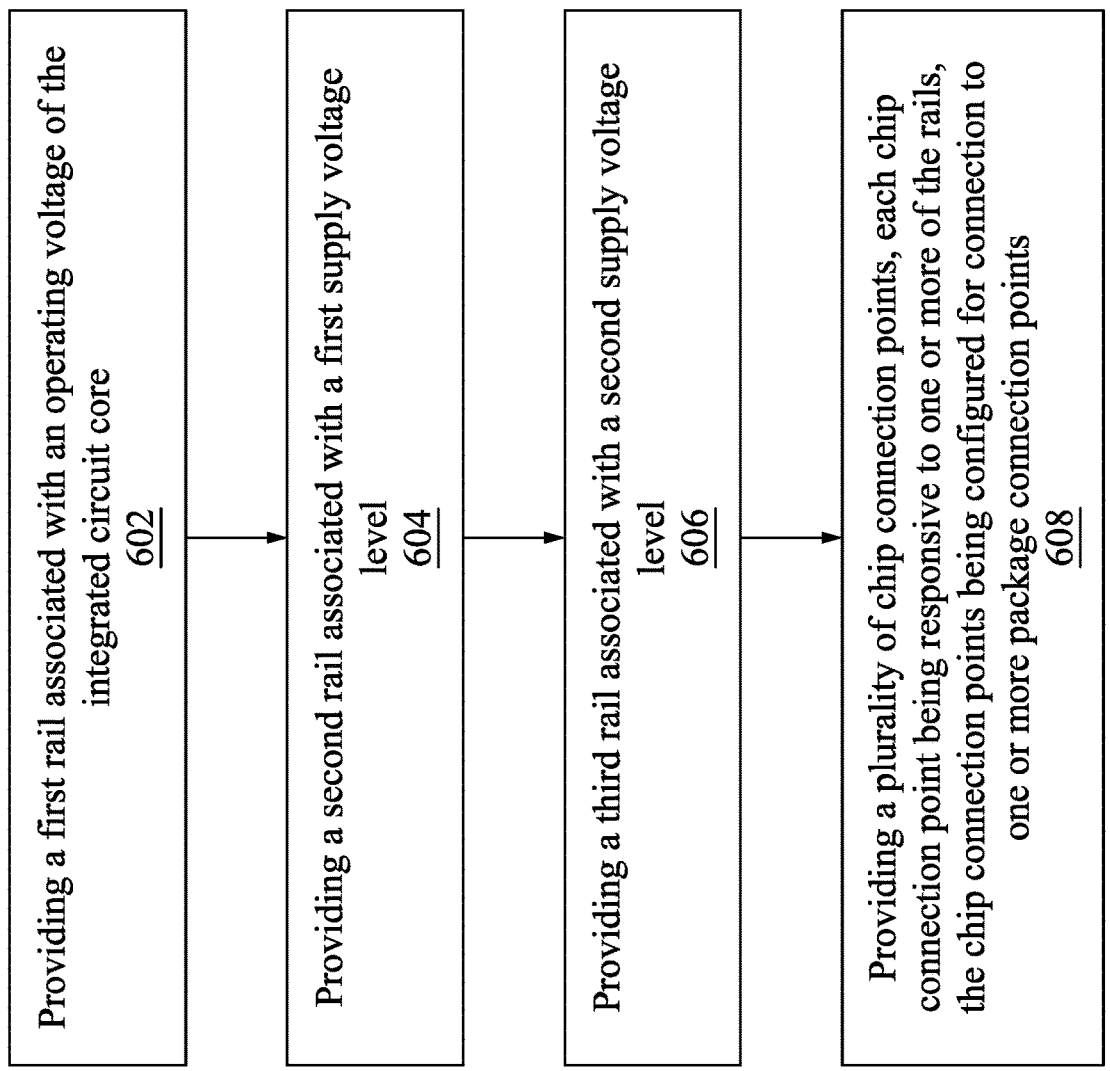
FIG. 6 is a flow diagram depicting a method of providing input/output signals to an integrated circuit via an IO circuit.

FIG. 6 is a flow diagram depicting a method of providing input/output signals to an integrated circuit via an IO circuit. At 602, a first rail associated with an operating voltage of the integrated circuit core is provided. At 604, a second rail is provided that is associated with a first supply voltage level, and at 606, a third rail associated with a second supply voltage level is provided. At 608, a plurality of chip connection points are provided, each chip connection point being connected to one or more of the rails, the chip connection points being configured for connection to one or more package connection points.

Figure 7:
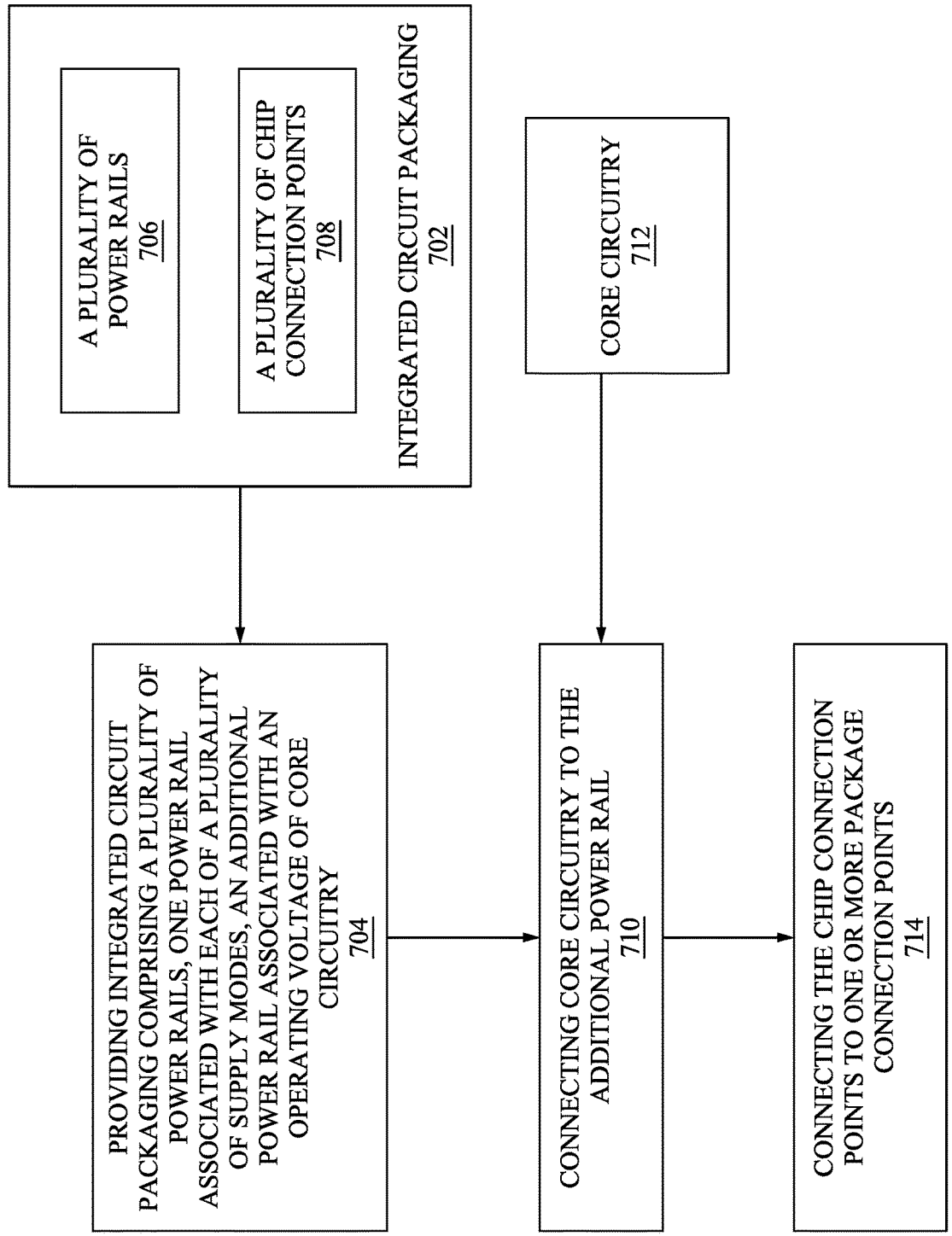
FIG. 7 is a flow diagram depicting steps of an example method.

FIG. 7 is a flow diagram depicting steps of an example method. In the method, integrated circuit packaging 702 is provided at 704. The integrated circuit packaging comprises a plurality of power rails 706, one or more supply mode power rail being associated with each of a plurality of supply modes, and a core power rail being associated with an operating voltage of core circuitry; and a plurality of chip connection points 708, each chip connection point being connected to one or more of the power rails. At 710, core circuitry 712 is connected to the core power rail, and at 714, the chip connection points are connected to one or more package connection points.

Systems and methods as described herein may take a variety of forms. In one example, systems and methods are provided for a multiple power supply mode input/output (IO) circuit of an integrated circuit that includes a plurality of power rails, one or more supply mode power rail being associated with each supply mode of the integrated circuit, and a core power rail being associated with core circuitry of the integrated circuit. The IO circuit further includes a plurality of chip connection points, each chip connection point being connected to one or more of the power rails, the chip connection points being configured for connection to one or more package connection points.

In another example, in a method of providing input/output signals to an integrated circuit via an IO circuit, a first rail associated with an operating voltage of the integrated circuit core is provided. A second rail is provided that is associated with a first supply voltage level, and a third rail associated with a second supply voltage level is provided. A plurality of chip connection points are provided, each chip connection point being connected to one or more of the rails, the chip connection points being configured for connection to one or more package connection points.

As a further example, an integrated circuit package includes core circuitry and integrated circuitry packaging comprising a plurality of package connection points configured for connection to an external circuit as well as an IO circuit. The IO circuit includes a plurality of power rails, one or more supply mode power rails being associated with each of a plurality of supply modes, and a core power rail being associated with an operating voltage of the core circuitry; and a plurality of chip connection points, each chip connection point being connected to one or more of the power rails, the chip connection points being connected to one or more of the package connection points.

As another example, in a method, integrated circuit packaging is provided. The integrated circuit packaging comprises a plurality of power rails, one or more supply mode power rail being associated with each of a plurality of supply modes, and a core power rail being associated with an operating voltage of core circuitry; and a plurality of chip connection points, each chip connection point being connected to one or more of the power rails. Core circuitry is connected to the core power rail, and the chip connection points are connected to one or more package connection points.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multiple power supply mode input/output (IO) circuit of an integrated circuit, comprising:
    a plurality of power rails, wherein one or more supply mode power rails are associated with each supply mode of the integrated circuit, and a core power rail is associated with core circuitry of the integrated circuit;
    a plurality of chip connection points, each chip connection point being connected to one or more of the power rails, the chip connection points being configured for connection to one or more package connection points; and
    one or more IO circuit cells, wherein an IO circuit cell associated with an electrostatic discharge function is associated with a connection to one of the plurality of power rails, an IO circuit cell is associated with a connection to a supply mode power rail and the core power rail, and an IO circuit cell that comprises a level shifting circuit is associated with an input/output function.

2. The IO circuit of claim 1, wherein each chip connection point is associated with an IO circuit cell, wherein each IO circuit cell provides one of a plurality of IO circuit functions.

3. The IO circuit of claim 2, wherein one of the IO circuit functions is:
    a power providing function;
    an input/output function; or
    an electrostatic discharge function.

4. The IO circuit of claim 2, wherein each IO circuit cell is further associated with a connection to one or more of the power rails.

5. The IO circuit of claim 2, wherein an IO circuit cell associated with a power providing function is associated with a connection to a supply mode power rail.

6. The IO circuit of claim 1, further comprising:
    a first core IO connection point for receiving data from or providing data to the core circuitry, wherein the core circuitry is configured to perform a computing function;
    wherein the first IO core connection point is connected to the core power rail.

7. The IO circuit of claim 1, wherein the first core IO connection point is associated with a first IO circuit cell, wherein a second core IO connection point is associated with a second IO cell.

8. The IO circuit of claim 1, wherein the IO circuit is configured to provide N supply modes, wherein the IO circuit comprises N+1 power rails.

9. The IO circuit of claim 1, wherein a first chip connection point is configured for connection to multiple package connection points.

10. The IO circuit of claim 9, wherein a second chip connection point is configured for connection exactly one package connection point.

11. The IO circuit of claim 10, wherein the first chip connection point is associated with an input/output function, wherein the second chip connection point is associated with a power providing function.

12. The IO circuit of claim 10, wherein the first chip connection point is associated with an electrostatic discharge function.

13. The IO circuit of claim 2,
    wherein the IO circuit cell associated with the electrostatic discharge function comprises an electrostatic discharge circuit.

14. A method of fabricating an input/output (IO) circuit, comprising:
    providing a first rail associated with an operating voltage of an integrated circuit core;
    providing a second rail associated with a first supply voltage level;
    providing a third rail associated with a second supply voltage level;
    routing connections from the first rail, the second rail, and the third rail to a plurality of chip connection points, each chip connection point being connected to one or more of the rails;
    connecting each chip connection point to one or more package connection points; and
    providing level shifting of a signal between the first rail and one of the second and third rails for an IO cell associated with an input/output function.

15. The method of claim 14, wherein the IO circuit is configured to communicate with a first external circuit via a first subset of package connection points; and
    wherein the IO circuit is configured to communicate with a second external circuit via a second subset of package connection points.

16. The method of claim 14, wherein each chip connection point is associated with an IO cell, wherein each of a plurality of IO cells is configured to provide a function selected from the group consisting of:
    a power providing function;
    an input/output function; or
    an electrostatic discharge function.

17. The method of claim 16, further comprising:
    providing electrostatic discharge of current conducted from a package connection point connected to a chip connection point associated with an electrostatic discharge function IO cell.

18. A method, comprising:
    providing integrated circuit packaging comprising:
        a plurality of power rails, wherein one or more supply mode power rails are associated with each of a plurality of supply modes, and a core power rail is associated with an operating voltage of core circuitry;
        a plurality of chip connection points, each chip connection point being connected to one or more of the power rails; and
        one or more IO circuit cells, wherein an IO circuit cell associated with an electronic discharge function is associated with a connection to one of the plurality of power rails;
    connecting core circuitry to the core power rail; and connecting the chip connection points to one or more package connection points, and providing level shifting of a signal between the core power rail and one of the supply mode power rails.

19. The method of claim 18, further comprising:

connecting a first subset of the package connection points to a first external circuit configured to operate at a first voltage; or in the alterative connecting a second subset of the package connection points to a second external circuit configured to operate at a second voltage.

20. The method of claim 18, further comprising providing level shifting of the signal for an IO cell associated with an input/output function.

\* \* \* \* \*